United States Patent
Yamazaki et al.

(10) Patent No.: US 6,919,215 B2
(45) Date of Patent: Jul. 19, 2005

(54) METHOD OF MANUFACTURING LIGHT EMITTING DEVICE

(75) Inventors: Shunpei Yamazaki, Setagaya (JP); Masakazu Murakami, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/674,602

(22) Filed: Oct. 1, 2003

(65) Prior Publication Data

US 2005/0070039 A1 Mar. 31, 2005

(30) Foreign Application Priority Data

Oct. 9, 2002 (JP) ........................................ 2002-296668

(51) Int. Cl.[7] ............................................... H01L 21/00
(52) U.S. Cl. ............................ 438/21; 438/30; 438/155; 438/33
(58) Field of Search .............................. 438/21, 30, 155, 438/328, 613, 33; 257/59, 86; 345/205

(56) References Cited

U.S. PATENT DOCUMENTS

| 6,391,137 | B1 | * | 5/2002 | Matsushima | 156/250 |
| 6,426,787 | B1 | * | 7/2002 | Satake et al. | 349/138 |
| 6,489,952 | B1 | * | 12/2002 | Tanaka et al. | 345/205 |
| 6,638,781 | B1 | * | 10/2003 | Hirakata et al. | 438/30 |
| 6,707,521 | B2 | * | 3/2004 | Satake et al. | 349/138 |
| 6,734,924 | B2 | * | 5/2004 | Hirakata et al. | 349/39 |
| 6,781,152 | B2 | * | 8/2004 | Yamazaki | 257/59 |
| 6,800,871 | B2 | * | 10/2004 | Matsuda et al. | 257/30 |
| 6,828,587 | B2 | * | 12/2004 | Yamazaki et al. | 257/72 |
| 6,839,108 | B1 | * | 1/2005 | Hirakata et al. | 349/114 |
| 6,849,877 | B2 | * | 2/2005 | Yamazaki et al. | 257/86 |
| 2003/0017777 | A1 | | 1/2003 | Matsuoka et al. | |
| 2003/0162317 | A1 | | 8/2003 | Tanaka et al. | |

FOREIGN PATENT DOCUMENTS

| JP | 11-295755 | 10/1999 |
| JP | 2001-100167 | 4/2001 |
| JP | 2002-277860 | 9/2002 |
| JP | 2003-17259 | 1/2003 |
| JP | 2003-022032 | 1/2003 |
| JP | 2003-248208 | 9/2003 |
| JP | 2003-271067 | 9/2003 |

OTHER PUBLICATIONS

International Search Report dated Feb. 10, 2004, Application No. PCT/JP03/11702, 3 pages.

* cited by examiner

Primary Examiner—Michael S. Lebentritt
Assistant Examiner—Olivia T. Luk
(74) Attorney, Agent, or Firm—Eric J. Robinson; Robinson Intellectual Property Law Office, P.C.

(57) ABSTRACT

The present invention provides a manufacturing method of a light emitting device in which the number of display panels manufactured from one substrate is increased and display panel is mass produced is provided. One feature of the invention is that the shipping is performed not by separating the substrate over which a plurality of light emitting regions is formed and attaching the FPC to the each piece thereof but before separating, namely in the incomplete state (that can be also referred to as semi end products). However, the invention has a structure in which the inspection can be partly carried out before the shipping.

9 Claims, 13 Drawing Sheets

FIG. 2
(A) STICKING·FIRST DIVIDING
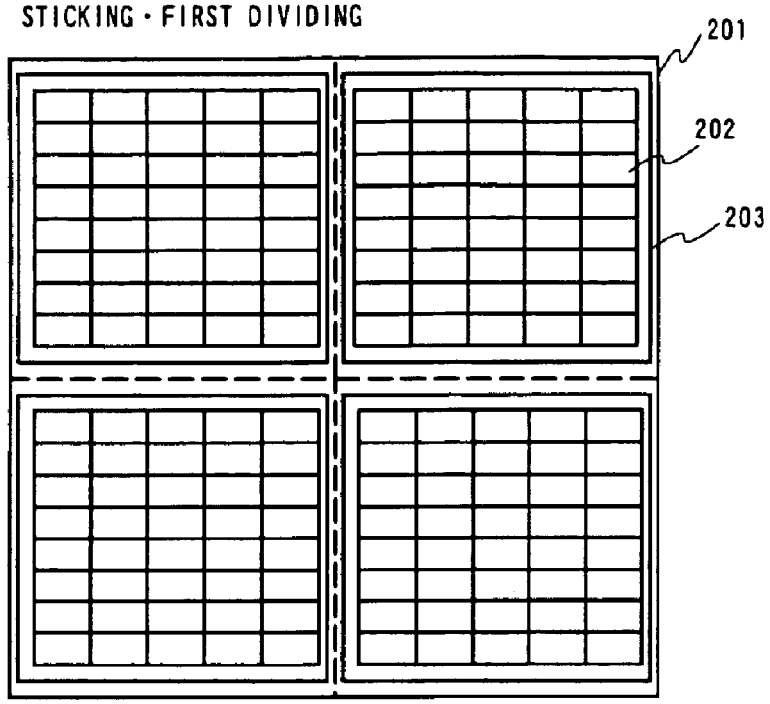
(B) SECOND DIVIDING (TOP VIEW)
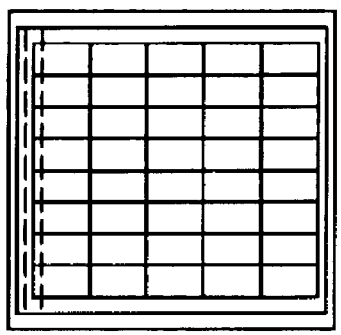
(C) CROSS SECTION
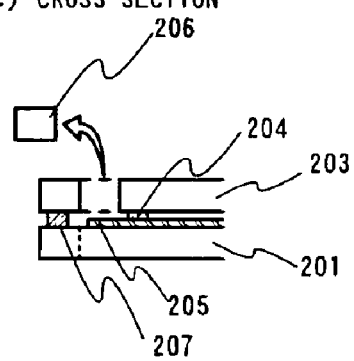
(D) PARTIAL INSPECTION (TOP VIEW)
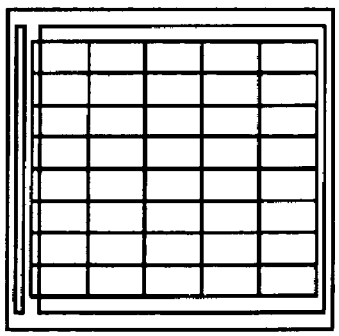
(E) CROSS SECTION DURING INSPECTION
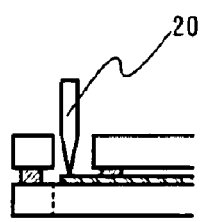

FIG. 3
(A) ANTISTATIC · SHIPPING
(B) TOP VIEW
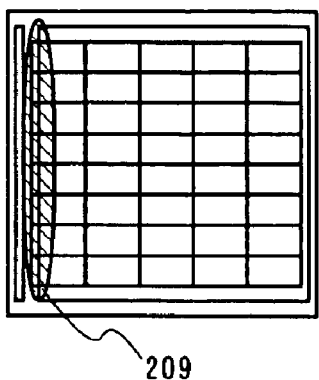
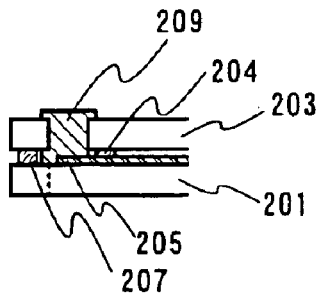
(C) THIRD DIVIDING (TOP VIEW)   (D) THRID DIVIDING (CROSS SECTION)
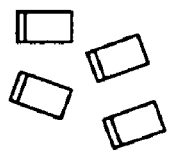
(E) STICKING FPC (TOP VIEW)   (F) CROSS SECTION
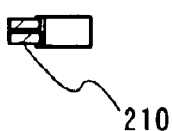
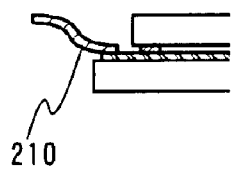

FIG. 4
(A) OBLIQUE DRAWING
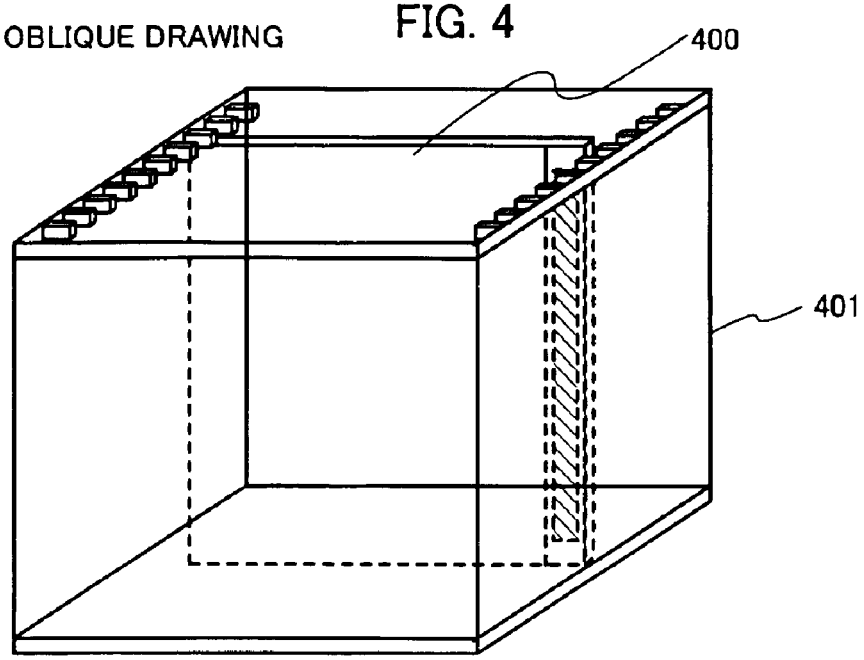
(B) TOP VIEW
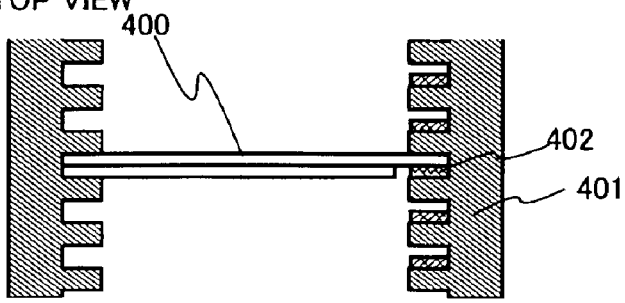
(C) OBLIQUE DRAWING
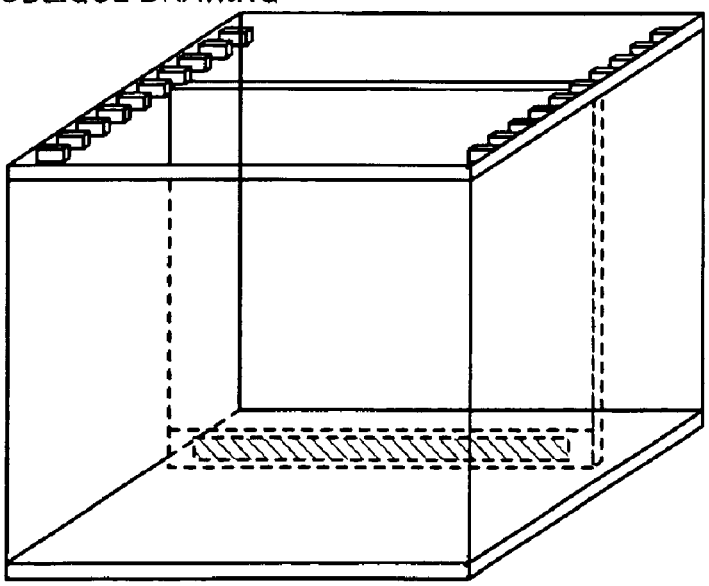

FIG. 5
(A) PARTIAL DIVIDING OF SEALING SUBSTRATE
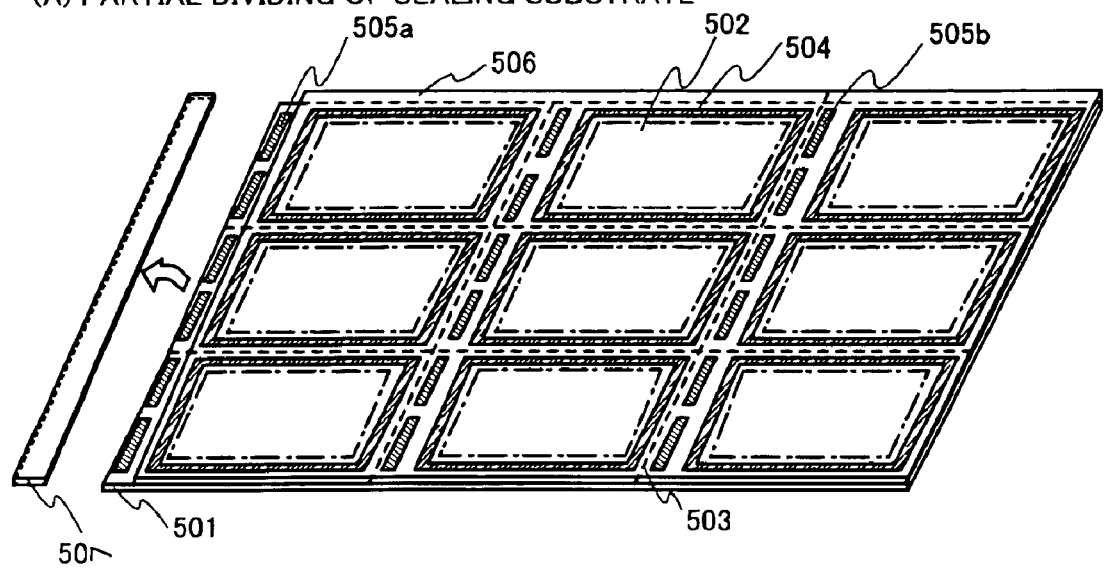
(B) AFTER STICKING FPC
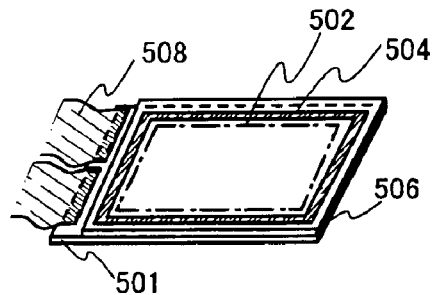

FIG. 6
(A) DIVIDING (TOP VIEW)
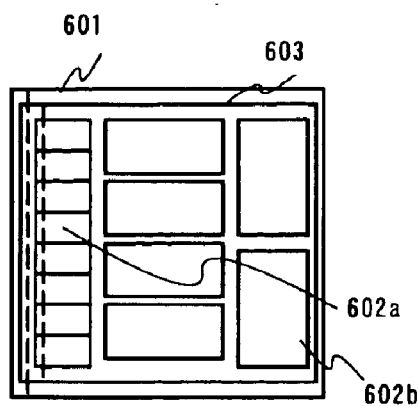
(B) CROSS SECTION
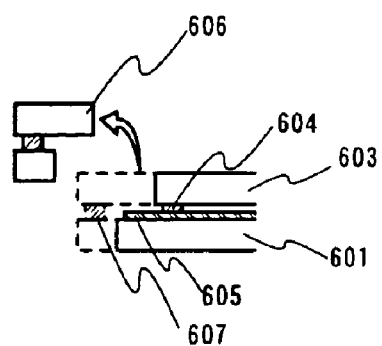
(C) PARTIAL INSPECTION (TOP VIEW)
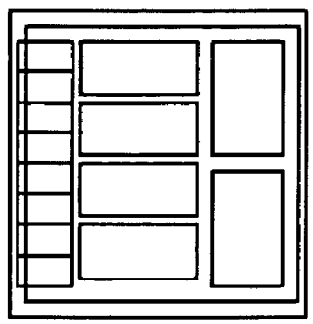
(D) CROSS SECTION DURING INSPECTION
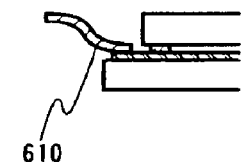
(E) THIRD DIVIDING (TOP VIEW)
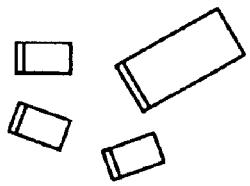
(F) THIRD DIVIDING (CROSS SECTION)
(G) STICKING FPC (TOP VIEW)
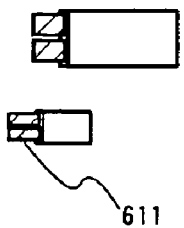
(H) CROSS SECTION
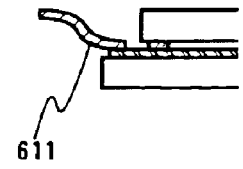

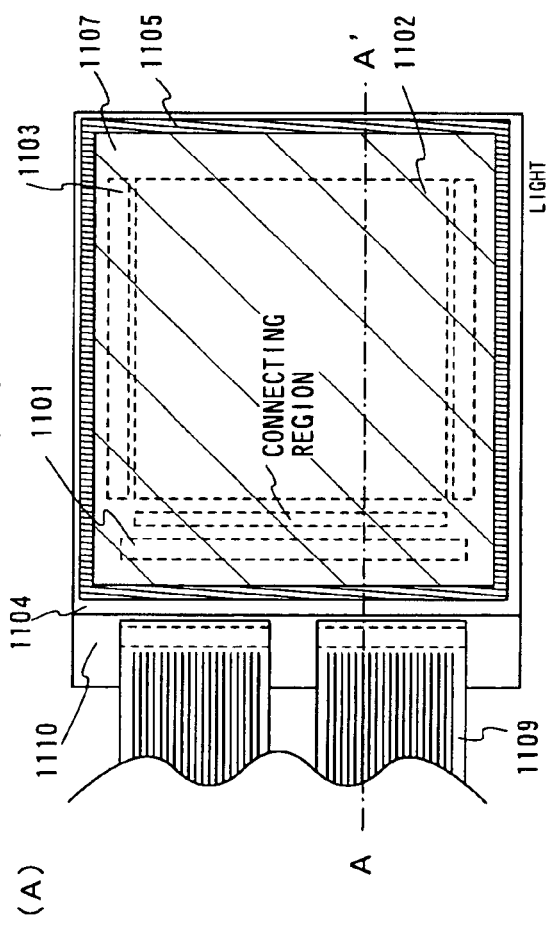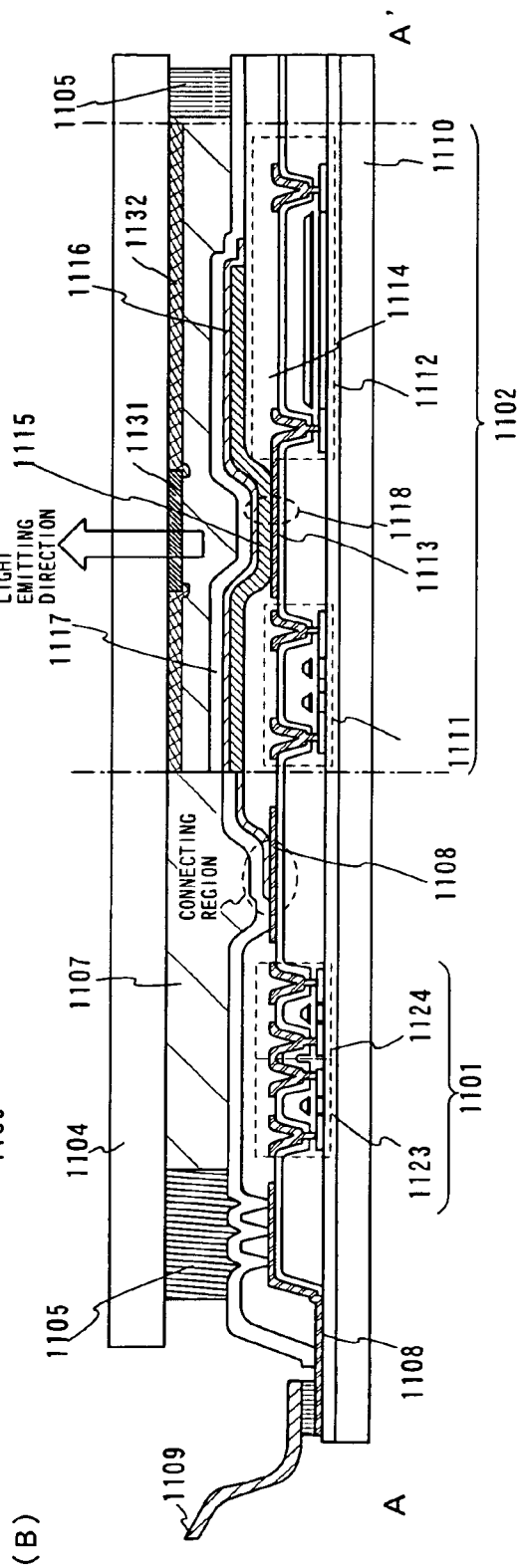
FIG. 7

FIG. 9
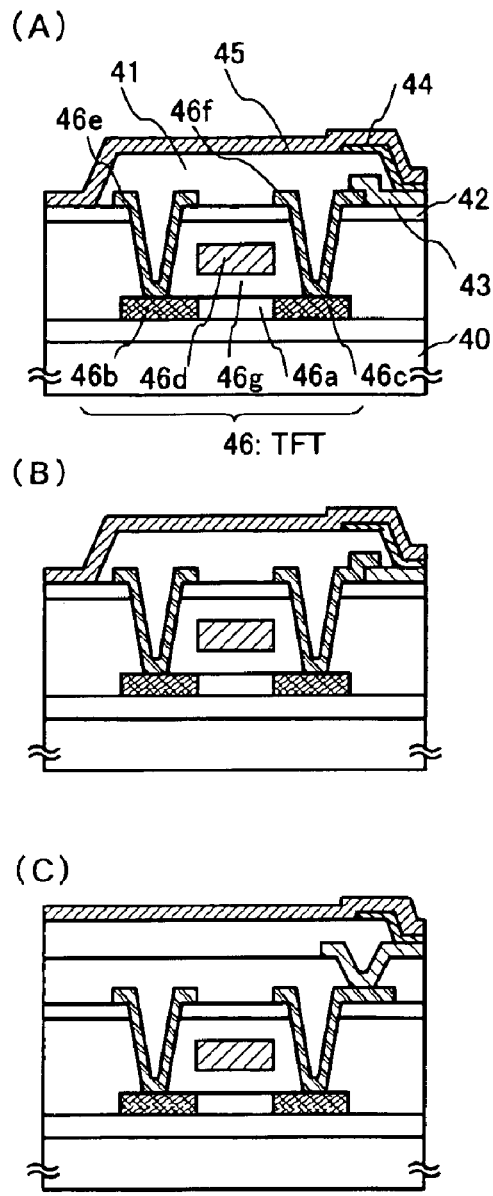
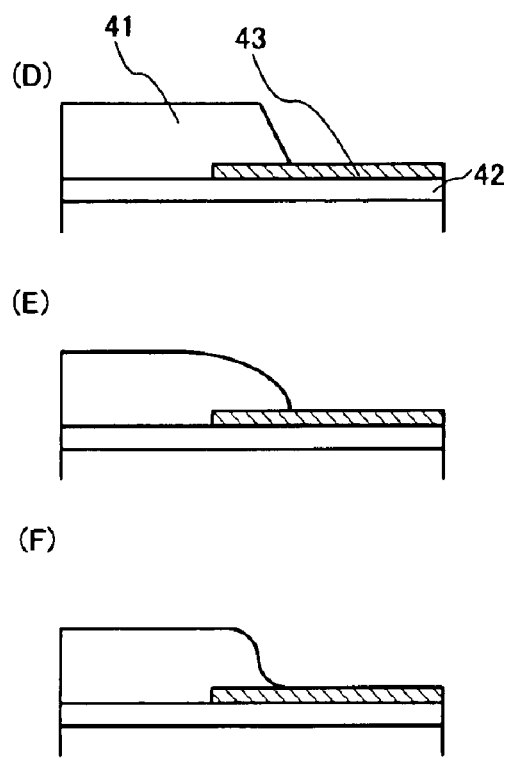

FIG. 12
(A)
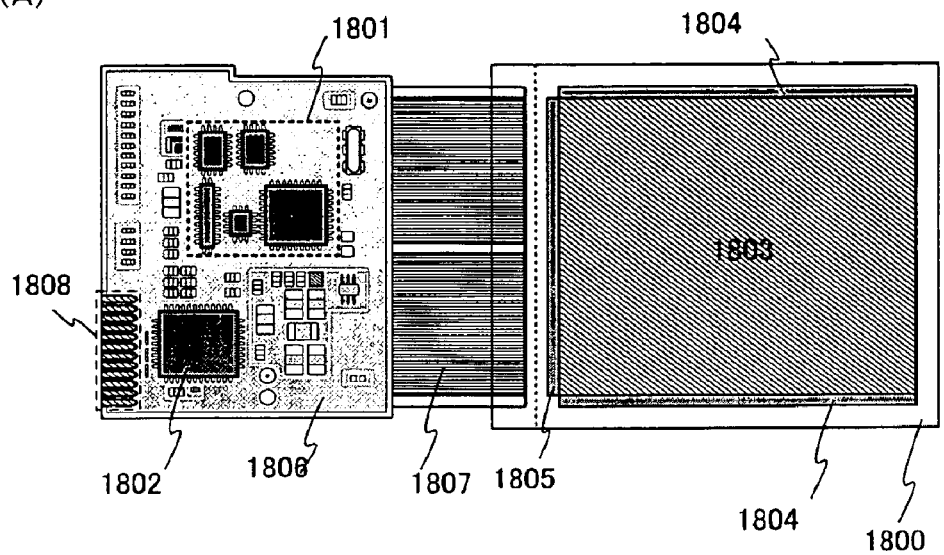
(B)
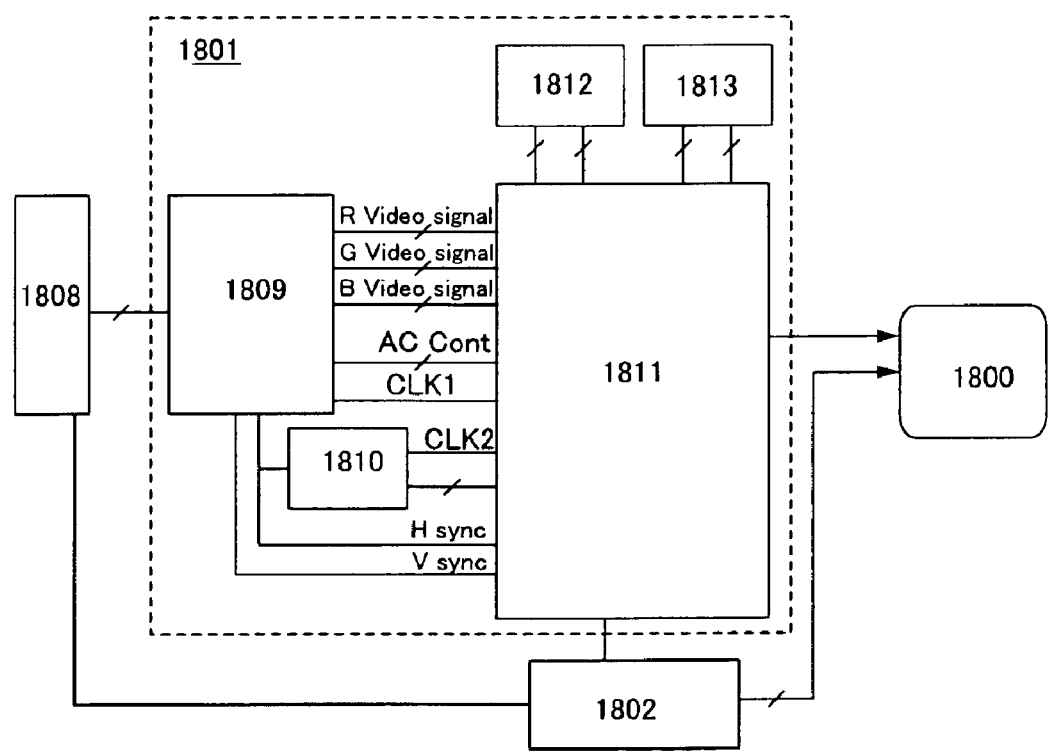

METHOD OF MANUFACTURING LIGHT EMITTING DEVICE

BACKGROUND OF THE INVENTION

1. Field of the Invention

The present invention relates to a method for manufacturing a light emitting device having a light emitting element over a substrate and a manufacturing system thereof. Specifically, the present invention relates to a method for manufacturing a light emitting device wherein a layer including an organic compound is to be a light emitting layer and a manufacturing system thereof.

2. Description of Related Art

In recent years, studies on a light emitting device having an EL element as a luminous element have intensified. In particular, a light emitting device using an organic material as an EL material has attracted an attention. The light emitting device is referred to as an organic EL display (OELD) or an organic light emitting diode (OLED).

Note that an EL element includes a layer containing an organic compound in which luminescence (Electro Luminescence) generated by applying an electric field is obtained (hereinafter, referred to as an EL layer), an anode, and a cathode. In luminescence emitted by an organic compound, there are fluorescence that generates when electrons return from a excited singlet state to a ground state and phosphorescence that is emitted when electrons return from a triplet excited state to a ground state. A light emitting device manufactured according to a deposition device and deposition method of the present invention is applicable to both kinds of luminescence.

Further, there are two kinds for forming the light emitting device: a method where an EL layer is formed between two kinds of striped electrodes provided so as to cross at right angles to one another (a simple matrix method), and a method where an EL layer is formed between a pixel electrode which are connected to a TFT and arranged in matrix and a counter electrode.

An EL element has a structure in which an EL layer is sandwiched between a pair of electrodes; generally, the EL layer has a laminated structure. Typically, the laminated structure, "a hole transporting layer/a light emitting layer/an electron transporting layer" proposed by Tang et al. of Kodak Eastman Company is generally known. The structure has extremely high luminous efficiency and is employed for almost all light emitting devices that are under development now.

Further, a structure in which a hole injecting layer/a hole transporting layer/a light emitting layer/an electron transporting layer are laminated in order over an anode or a hole injecting layer/a hole transporting layer/a light emitting layer/an electron transporting layer/an electron injecting layer are laminated in order over an anode is also applicable. Fluorescent pigment and the like can be doped to the light emitting layer. Such layers may be formed by entirely using a low molecular weight material or by partly using a high molecular weight material to the part of the layers.

Further, a light emitting device has no viewing angle problems by virtue of its self-luminous property differently from a liquid display device. Thus the light emitting device is more suitable for using in the open air than the liquid crystal display device. Various types of usage of the light emitting device have been proposed.

In production lines of a liquid crystal display device, the size of a substrate tends to become larger year by year in order to reduce the production costs. Further, the number of display panels (the number of panel faces) manufactured per substrate has been increased.

SUMMARY OF THE INVENTION

Problems to be Solved by the Invention

In production line of an active matrix type liquid crystal panel provided with a pixel TFT in matrix over a substrate, an inspection is carried out at the stage where a pixel electrode is formed, a capacitor is formed by utilizing the pixel electrode in non-contact, and the defect of the pixel TFT is discriminated with the capacitor value.

Further, when a sampling inspection is carried out, the substrate which is used for the sampling inspection does not become a panel for the last time. Therefore, in the case where the number of panels in one substrate is large, which results in extremely low yield.

Further, the defect of the pixel TFT can be discriminated by being provided with a circuit or a terminal for the inspection over the same substrate as the TFT, however, extra patterns increases and a complex circuit configuration is made.

After carrying out the inspection, the liquid crystal panel is completed by sealing a counter substrate, injecting a liquid crystal, and attaching an FPC. The liquid crystal is shipped or continuously assembled, thus progressing to end products.

Further, a large quantity of the defective display panels that are to be eliminated are occurred in the case where all the inspections are not carried out at all until the FPC is attached.

The manufacturing method described above is a method for manufacturing a liquid crystal display panel, and a manufacturing method of an active matrix type light emitting display device is not yet established.

In the liquid crystal display device, there is few problem when the inspection is carried out at the stage where the pixel electrode is formed since an orientation film is formed over the pixel electrode. However, in the active matrix type light emitting device, there is a threat of occurrence of the display defect only by adhesion of fine dust to the pixel electrode during the inspection when the inspection is carried out at the stage where the pixel electrode is formed since a layer including an organic compound with ultra thin film thickness is formed over the pixel electrode. Further, sealing process is preferably performed as soon as possible since the layer including the organic compound is vulnerable to oxygen and moisture.

Because the organic compound used for the light emitting element is quite expensive, and only one third to quarter or less of the whole EL materials put into a crucible at first are used in vapor deposition for forming a layer including an organic compound, a usage rate is extremely low.

According to the invention, a manufacturing method of the display panel in which the number of display panels (the number of panel faces) manufactured from one substrate is increased, and which is provided with a light emitting element that mass produces the display panel in high yield (a layer including an organic compound is referred to as a light emitting layer) is provided. According to the manufacturing method of the invention, a cost of end products is reduced.

Means for Solving the Problems

According to the invention, after manufacturing a TFT and a light emitting element and carrying out sealing, the inspection of the TFT and the light emitting element and then shipping thereof (or transporting to the different place) are carried out. Thereafter a FPC is attached to the TFT and the light emitting element after separating them respectively at the shipped destination. Specifically, according to the invention, the inspection is not carried out until sealing in order to prevent contamination of dust, so that the yield is improved. Note that the inspection (the light emitting inspection and drive inspection) is only performed for a part of panels, and the panel without a defect after the inspection is also assembled to the end products. For example, in the case where two-inch panels are arranged in 5 lines×8 columns, only one line (8 panels) are examined. In the inspection, one part of the sealing substrate is separated and the terminal portion of the FPC is exposed so as to have a contact with an electrode needle for the inspection or the FPC for the inspection. Further, since the terminal portion of the FPC which is to be attached later can be used as a pad for the inspection, the circuit and the terminal for the inspection are not necessary. Namely, in the invention, after the inspection is done, it is possible to continuously assemble to be end products, thereby improving the yield.

Further, on shipping, they are set to a carrier box provided with an antistatic material so as to have a contact with the terminal portion of the FPC used in the inspection has done. If the antistatic is inadequate, one part where the inspection is carried out in one substrate (the part where the FPC connection terminal is exposed) may be destroyed. However, the light emitting region in the other part of one substrate is covered with the sealing substrate and protected. Consequently, the light emitting region is not shipped by separating piece by piece, but a plurality of light emitting regions is remained integrated when shipping, and then separated piecemeal at the shipped destination. Accordingly, in the case where the light emitting region is in a small size, for example, the size where the display panel has a 2 inches diagonal, the shipping is carried out conveniently. Then, after the light emitting regions are separated at the shipped destination, the FPC is attached thereto and the inspection is performed piece by piece. The qualitative product that passed the inspections is assembled to the end products, thereby completing the light emitting device.

One feature of the invention is that the shipping is performed not after separating the substrate over which a plurality of light emitting regions is formed and attaching the FPC to the each piece thereof but before separating, namely in the incomplete state (that can be also referred to as a semi end products). However, the invention has a structure where the inspection can be partly carried out before the shipping.

A structure of the invention disclosed in this specification, as the example thereof shown in FIG. 1, is a method for manufacturing a light emitting device manufactured by zoning a substrate into a plurality of blocks and by zoning each block into a plurality of light emitting regions, at the first place the method comprises: a first step of forming a plurality of light emitting regions and terminal portions over a first substrate; a second step of sealing the light emitting element with a second substrate; a third step of eliminating one part of the second substrate overlapped with one part of the terminal portion among a plurality of terminal portions by separating, and exposing the one part of the terminal portion; a fourth step of inspecting by applying a current only to the one part of the terminal portion; and a fifth step of transporting from the first place to a second place, and at the second place the method comprises: a sixth step of separating the first and the second substrates and dividing the each light emitting region; a seventh step of and attaching an FPC to a terminal portion connected to one light emitting region.

In addition, in the above structure, one feature of the invention is that n×m (n>1, and m>1) light emitting regions are arranged in n lines and m columns on the substrate.

Further, another structure of the invention, as the example thereof is shown in FIGS. 2 and 3, is a method for manufacturing a light emitting device manufactured by zoning a substrate into a plurality of blocks and by zoning the each block into a plurality of light emitting regions, at a first place the method comprises: a first step of forming a light emitting region and a terminal portion over a first substrate; a second step of sealing the light emitting element with a plurality of second substrates; a third step of dividing the first substrate; a fourth step of eliminating the one part of the second substrate overlapped with the one part of the terminal portion in a plurality of terminal portions by dividing, and exposing the one part of the terminal portion; a fifth step of inspecting by applying a current only to the one part of the terminal portion; and a sixth step of transporting from a first place to a second place, and at the second place the method comprises: a seventh step of separating the first and the second substrates and dividing the each light emitting region; and an eighth step of attaching an FPC to a terminal portion connected to one light emitting region.

Further, according to the each structure described above, one feature of the invention is that the plurality of light emitting elements and the plurality of TFTs are provided for the light emitting region.

Further, according to each structure described above, one feature of the invention is that the second substrate has the same size as that of the first substrate, or smaller size than that of the first substrate.

Further, in the present specification, the first place (or the second place) indicates a production factory or an industrial company. Although each of the first place and the second place is different in principle, it is not specifically limited as long as the distance thereof is standoff. For example, each of the places may be different factory in the same company, or the first place may be an associated company and the second company may be a holding company.

Note that in this specification, all the layers provided between a cathode and anode are collectively referred to as an EL layer. Therefore, the above mentioned hole injection layer, hole transporting layer, light emitting layer, electron transporting layer and electron injection layer are all included in the EL layer.

Further, in this specification, an EL element is a light emitting element having a structure in which the layer including the EL material and an organic material or an inorganic material (hereinafter referred to as an EL layer) for injecting a carrier to the EL material is sandwiched between two electrodes (cathode and anode), and indicates a diode composed of an anode, a cathode and an EL layer.

Furthermore, the invention is not limited to an active matrix type light emitting device as long as it is an light emitting device having a layer including the organic compound. The invention can be applied to a passive matrix type light emitting device which becomes a color display panel or an area color light emitting device which becomes a surface light source or a device for illuminations.

Effects of the Invention

According to the present invention, multi-panel forming can be performed without being provided with a circuit and a terminal for the inspection. Further, according to the present invention, the panels over which the inspection has done are also incorporated the end products, therefore, yield is improved and the panel can be efficiently manufactured.

BRIEF DESCRIPTION OF THE DRAWINGS

FIGS. 2A–2E are diagrams which show Embodiment Mode 2.

FIGS. 3A–3F are diagrams which show Embodiment Mode 2.

FIGS. 4A–4C are diagrams which show Embodiment Mode 3.

FIGS. 5A–5B are diagrams which show Embodiment 1.

FIGS. 6A–6H are diagrams which show Embodiment 2.

FIGS. 7A–7B are diagrams which show a light emitting device (Embodiment 3).

FIGS. 9A–9F are diagrams which explain a connection between a TFT and a first electrode, and a shape of a barrier (Embodiment 4).

FIGS. 12A–12B are diagrams which show a module (Embodiment 6).

EMBODIMENT MODES OF THE INVENTION

Embodiment mode of the invention is described below.
Embodiment Mode 1

Figure 1:
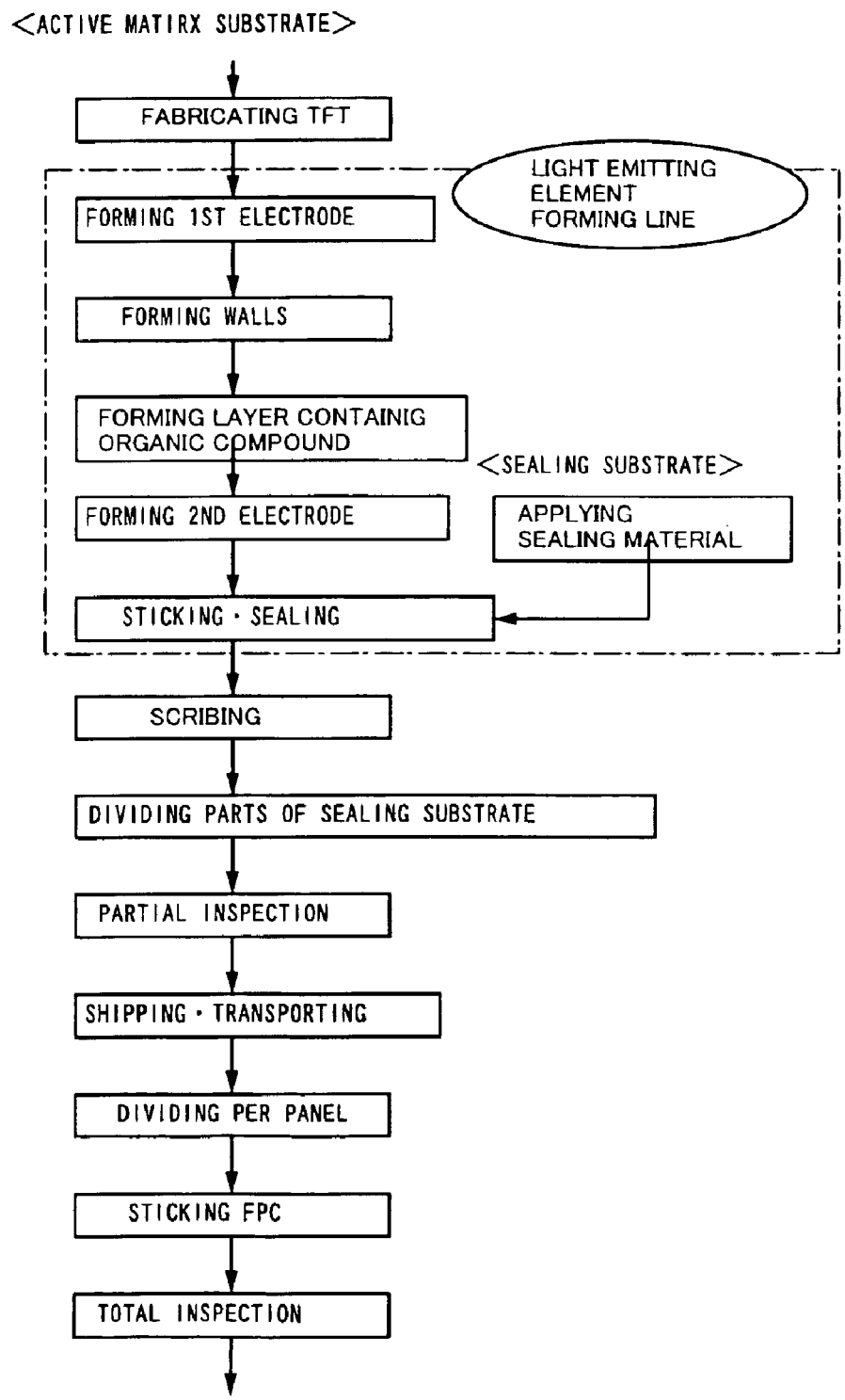
FIG. 1 is a flow diagram which shows Embodiment Mode 1.

An example of a flow of the present invention in which a panel is manufactured with multi-panel forming is shown in FIG. 1.

The invention provides a method in which a light emitting device is manufactured efficiently for a large size substrate having a size of, for example, such as 320 nm×400 nm, 370 nm×470 nm, 550 nm×650 nm, 600 nm×720 nm, 680 nm×880 nm, 1000 nm×1200 nm, 1100 nm×1250 nm, and 1150 nm×1300 nm.

First, a TFT is manufactured over the large sized substrate including an insulating surface by using a known technique. Here, a substrate where TFTs are arranged in matrix is referred to as an active matrix substrate.

In a process of manufacturing the TFT, a sampling inspection may be carried out conventionally. In the case where some sort of trouble is found in this sampling inspection, massive occurrence of the defect substrates to be eliminated can be prevented by coping well with the trouble, and itl results in preventing debasement of the end products from occurring. The TFT (a p-channel type TFT or an n-channel type TFT) provided over a substrate is an element for controlling current which flows in the EL layer emitting light, and another TFT (an n-channel type TFT or a p-channel type TFT) or the plurality of TFTs is provided for one pixel. Further, a driver circuit composed of TFTs may be formed over the same substrate.

Next, a film including an organic compound (hereinafter referred to as "organic compound layer") between a pair of electrodes (cathode and anode) is provided to form a light emitting element in which fluorescence or phosphorescence is obtained by applying an electric field between the electrodes. Firstly, a first electrode which serves as an anode or a cathode is formed. Here, a transparent conductive film with a large work function (ITO (indium oxide tin oxide alloy), indium oxide zinc oxide alloy ($In_2O_3$—ZnO) or the like), zinc oxide (ZnO) or the like are used for the first electrode and an example functioned as an anode is described.

Further, in the case where a source electrode or drain electrode of the TFT is used as a first electrode without any change, or in the case where the first electrode is separately formed as to be in contact with a source region or a drain region, the TFT includes the first electrode.

Then, a wall (referred to as a bank, a barrier, an embankment, or the like) is formed at the both ends of the first electrode (anode) to surround a periphery of the first electrode. A curved surface having a curvature is to be at the top end portion and bottom end portion of the wall so as to obtain a preferable coverage. For example, in the case where positive type photosensitive acrylic is used as a material of the wall, the curved surface having a radius of curvature (0.2 $\mu$m to 3 $\mu$m) is preferably provided only for the top end portion of the wall. As the wall, either a negative type which is soluble in etchant by photosensitive light or a positive type which is soluble in etchant by light can be used.

Next, if it is necessary, the surface of the anode is rubbed and washed by using a porous sponge (typically, a sponge of PVA (polyvinyl alcohol) or nylon) soaked in a surfactant (weak alkaline). Immediately before forming a layer containing an organic compound, the substrate is heated in a vacuum for removing absorbed moisture in the whole substrate that is provided with the TFT and the wall. Moreover, the first electrode may be exposed to UV radiation immediately before forming the layer containing the organic compound.

Then, the layer containing the organic compound is selectively formed over the first electrode (anode) by vapor deposition method using an evaporation mask or ink jetting method. As the layer containing the organic compound, a high molecular weight material, a low molecular weight material, an inorganic material, a mixed layer formed of the above materials, a layer formed by dispersing above materials, or a lamination layer appropriately combining such layers may be used.

Further, a second electrode (cathode) is formed over the layer containing the organic compound. For forming the cathode, a material having a small work function (Al, Ag, Li, Ca, or alloy of these materials such as MgAg, MgIn, AlLi, $CaF_2$, or CaN) is used. If necessary, a protective layer formed by covering the second electrode by sputtering or vapor deposition is formed. The protective layer may be formed of a silicon nitride film, silicon oxide film, a silicon nitride oxide film (SiNO film: a composition ratio of N to O is N>O)), a SiON film: a composition ratio of N to O c is N<O), or a thin film containing carbon as its main component (for example, DLC film, or CN film), each of which are obtained by sputtering or CVD.

Then, a sealing member is applied to a glass substrate that serves as a sealing material in a desired pattern. Then, the sealing substrate over which a sealing member is drawn is bonded to an active matrix substrate so that the sealing pattern provided for the sealing substrate is sealed to encircle the light-emitting region provided for the active matrix substrate. The steps from the wall formation to the sealing are preferably performed without being exposed to air in order to increase the reliability of the panel.

Further, in order to conduct multi-panel forming, a plurality of light emitting regions are provided for one substrate; therefore, the same number of display panels as that of the light emitting regions can be obtained in the end. Further, the sealing substrate may have the same size as that of the active matrix substrate, or several pieces of the sealing substrate having smaller size than that of the active matrix substrate are attached.

Then, a scribe line for dividing the both substrates is drawn by using a diamond cutter or the like. A dummy pattern composed of the sealing member is preferably formed in advance so that the segmentation performed later becomes effective.

Next, the first segmentation is performed and only one part of the sealing substrate is separated. The part that is separated here is a portion overlapped with a terminal portion which is later attached to an FPC. However, the segmentation is not carried out to the entire light emitting region respectively, but to the one part of the light emitting region, for example, to the first line of the panels and keeps the terminal portion of the panels which locate behind the second line overlapped with the sealing substrate.

Next, the one part of the sealing substrate is removed, then the electrode needle is brought into a contact with the exposed terminal portion or current is flowed to the light emitting region by temporally attaching the FPC, thereby performing the light emitting inspection and the drive inspection. One part of the light emitting region formed over the substrate, for example, only one line of the panels is examined. In the substrate in which the result of the inspection was normal, the step is kept without any change; on the contrary, in the substrate in which the defect is found, the substrate is destroyed or used as the failure analysis.

Then, the substrate of which result of the inspection is normal is shipped or transported. In this step, transportation is convenient because the substrate is not separated to per panel piece by piece. It is preferable that an electrostatic breakdown is not generated on transportation, and it is desirable to protect the terminal portion which is inspected in a step before with an antistatic material and the like. A material which can be easily removed is preferably used as the antistatic material.

Then, each substrate is divided at the destination where it has shipped or transported. It may be divided after performing scribe, or may be divided in the scribe step immediately after attaching the seal substrate that is carried out in advance.

Next, the FPC is attached to the terminal portion respectively. After the FPC is attached, the inspection (light emitting inspection and drive inspection) is carried out again. The inspection here is carried out on all the panel.

According to the above steps, a display panel connected with the FPC is formed, and then, end products can be completed by incorporating into the electric apparatus appropriately.

According to the invention, multi-panel forming can be performed without providing a circuit and terminal for the inspection. Further, yield is improved since the panel with which the inspection is performed can be incorporated into the end products.

Embodiment Mode 2

Here, an example of preparing a plurality of pieces of sealing substrates having a size which is smaller than that of an active matrix substrate, and attaching to the active matrix substrate is shown.

For example, as an example is shown in FIG. 2(A), four sealing substrates which are slightly smaller than the active matrix substrate may be attached to an active matrix substrate 201. A plurality of light emitting regions 202 each of which is surrounded by a sealing member (not shown) is formed over the active matrix substrate 201 and sealed by a sealing substrate 203. In FIG. 2(A), one active matrix substrate (600 nm×720 nm) is divided into 4 pieces, each having 5 lines 8 columns (40 panels), namely, total 160 panels (two inches diagonal) can be manufactured from one substrate. Further, an example of arranging the panels in matrix is shown here; however, a line which is to be examined later is not specifically limited as long as the position of the terminal portions are aligned, and a variety size of the panels can be provided over one substrate.

First, the first segmentation where one active matrix substrate (600 nm ×720 nm) is divided into four pieces is carried out after the four sealing substrates are attached to the active matrix substrate. (FIG. 2(A))

Next, the second segmentation where one part of the sealing substrate overlapped with the terminal portion is separated is carried out (FIG. 2(B)). FIG. 2(B) shows a top view of a piece which is obtained by dividing an active matrix substrate into 4 pieces, and a cross sectional view thereof is shown in FIG. 2(C). In FIG. 2(C), reference numeral 204 denotes a sealing member, reference numeral 205 denotes a terminal portion, reference numeral 206 denotes a piece which is cut, and reference numeral 207 denotes a dummy seal. The dummy seal 207 is preferably provided so as to easily perform the second segmentation.

Then, only a part, for example, eight panels in the first line are examined. FIG. 2(D) shows a top view of the panel state during the inspection. In performing the inspection, an electrode needle 208 for the inspection is connected to the terminal portion as shown in FIG. 2(E), and current is flowed by the inspection equipment (not shown) provided with a current source connected to the electrode needle.

Then, the terminal portions of the eight panels are covered with an antistatic agent 209, and shipped or transported. The top view thereof is shown in FIG. 3(A) and the cross sectional view thereof is shown in FIG. 3(B). As the antistatic agent 209, a conductive coating film, for example, the film applied with a coating of surfactant, the film formed of a composition composed by dispersing an ionic conductive material such as inorganic salt such as lithium chloride and magnesium chloride, polyelectrolyte containing carboxylic acid group or sulfonic acid group into a substance for forming the film such as synthetic resin and silicate, or conductive polymer can be used.

Then, a third segmentation is performed so as to divide the panels piece by piece. The top view is shown in FIG. 3(C), and the cross sectional view is shown in FIG. 3(D). For the simplification, only four panels are shown in FIG. 3(C).

Lastly, the panel is completed by attaching an FPC 210 with the use of an anisotropic conductive material so as to connect electrically with the terminal portion. The top view is shown in FIG. 3(E), and the cross sectional view is shown in FIG. 3(F). For the simplification, only a panel is shown in FIG. 3(E).

Embodiment Mode 3

In Embodiment Mode 1 or Embodiment Mode 2, an example that a panel is provided with an antistatic agent and then transported or shipped is shown. Here, an example in which an antistatic agent is provided for a carrier box of a substrate used in transporting or shipping is shown.

An oblique drawing of the carrier box is shown in FIG. 4(A) and the top view thereof is shown in FIG. 4(B). A gap is provided for a side wall 401 of the carrier box, and an antistatic agent 402 is provided at the portion which has a contact with the terminal portion provided for an active matrix substrate 400. The antistatic agent 402 also serves as a cushioning material arranged in a contact area with the substrate and carrier box.

In addition, a top cover may be provided for the carrier box shown in FIG. 4(A).

Electrostatic breakdown can be prevented by performing the shipment or transporting with the use of the carrier box shown in FIG. 4(A), and the step in Embodiment Mode 2 (formation of the antistatic agent or the removal therefrom) can be reduced.

Further, the terminal portion provided on the active matrix substrate may be located in a bottom part of the carrier box. In this case, the antistatic agent is to be provided for the area connected with the terminal portion.

According to the carrier box shown in FIG. 4(A) and FIG. 4(C), transporting, holding and storing can be carried out without occurrence of the electrostatic breakdown and breakage of the substrate.

This embodiment mode can be freely combined with Embodiment Mode 1 or Embodiment Mode 2.

The present invention having the above structure will be described in detail in the following embodiments.

Embodiment 1

In this embodiment, FIG. 5 shows an example of manufacturing nine panels in total obtained from a substrate (5 inches diagonal) cut by three lines and three columns.

First, a light emitting element comprising an anode, a cathode, and a layer including an organic compound sandwiched therebetween, and a TFT for controlling current which flows to the light emitting element are provided over a substrate having an insulating surface. A plurality of light emitting elements is arranged in matrix so as to form a light emitting region 502, and a plurality of the light emitting regions 502 are provided. Further, terminal portions 505a and 505b for connecting with an external circuit are formed at the same time as the TFT is formed. Here, a substrate provided with the plurality of light emitting regions 502 and the terminal portion thereover is referred to as an active matrix substrate 501. For the last, one of the light emitting regions serves as one panel display region.

Further, a sealing substrate is attached with a sealing member provided in an outer periphery of the light emitting region 502 so as to surround the light emitting region 502 to seal the light emitting element. As the sealing substrate, a glass substrate or a plastic substrate in which a sealing film is coated over the surface is used. A dummy seal may be formed in the periphery which serves as a parting line 503 to segment easily.

Since the light emitting element is specifically vulnerable to oxygen and moisture, it is preferable that the light emitting element is not exposed to air and the time from forming the light emitting element to sealing the sealing substrate is cut down as much as possible.

After sealing the sealing substrate, only a part of the sealing substrate is separated and is removed in order to carry out the inspection. In the step of the segmentation, the parting line is drawn with a diamond cutter, and then pressure is put by a breaker, thereby cutting the substrate along the parting line. In this embodiment, as shown in FIG. 5(A), a detached substrate 507 is separated, and the terminal portions 505a of three panels are exposed. Note that another terminal portion 505b is sandwiched between the sealing substrate and the active matrix substrate.

Then, current is flowed from the exposed terminal portion 505a, and the drive condition and the light emitting condition thereof are examined. The inspection may be performed by connecting an electrode needle to the terminal portion 505a or an FPC for the inspection may be attached with a bonding member that can be freely detached. In this embodiment, there are three panels which are connected to the exposed terminal portions 505a, and only the three panels are examined. Since not all panels are examined, the time and the trouble for the inspection can be reduced. In addition, there is no need to provide separately a circuit and a terminal for the inspection.

After the inspection, the panels with good quality is shipped or transported. In this embodiment, nine panels in an integrated state are shipped. Due to the integration, transportation is convenient. Furthermore, the terminal portion 505b is overlapped with the sealing substrate during transportation; therefore, dust and the like can be prevented from adhering.

Then, a plurality of panels as shown in FIG. 5(B) can be manufactured by segmenting at the shipped destination and attaching an FPC 508 to each of the panels. In this embodiment, nine panels including three panels in which the inspection is performed can be completed. Since the panel in which the inspection is performed serves as end products, yield can be improved.

Lastly, the panel as shown in FIG. 5(B) is incorporated into an electric apparatus, and the electric apparatus can be completed.

In addition, this embodiment can be freely combined with any one of Embodiment Modes 1 to 3.

Embodiment 2

In this embodiment, FIG. 6 shows an example of manufacturing panels each in a different size from one substrate. Further, in this embodiment, an example in which a TFT is examined not by an inspection device provided with an electrode needle as shown in Embodiment Mode 2 but by a device provided with a current source by temporarily attaching an FPC.

In FIG. 6(A), two kinds of panels in a different size are manufactured. Fourteen panels in total, eight small size panels and six middle size panels are manufactured from a substrate. The panels to be examined are arranged in a line, and the direction of other panels not to be examined is not specifically limited.

First, a light emitting regions 602a and 602b are formed over an active matrix substrate 601 as Embodiment Mode 2, and sealed with a sealing substrate 603 by using a sealing member 604. A top view at this step is shown in FIG. 6(A).

Next, a part of the sealing substrate 603 overlapped with a terminal portion 605 is removed as well as a part of an active matrix substrate to inspect over the light emitting region 602a. A cross sectional view thereof at this step is shown in FIG. 6(B).

Then, the light emitting region 602a is examined. A top view at this step is shown in FIG. 6(C). FIG. 6(D) shows a cross sectional view during the inspection. The inspection is performed while a detachable conductive adhesive agent is attached thereto by using an FPC (an FPC 610 for the inspection) and then, the FPC and the inspection device is connected.

After the inspection, the panel with good quality is shipped after taking off the FPC for the inspection. In this embodiment, fourteen panels are shipped in an integrated state.

Next, segmentation is performed at the shipped destination. The top view at this point is shown in FIG. 6(E), and the cross sectional view at this point is shown in FIG. 6(F). For the simplification, only four panels are shown in FIG. 6(E).

The FPC 611 is attached so that a plurality of panels in a different size as in FIG. 6(F) can be manufactured. Here, the cross sectional view is shown in FIG. 6(H). In this embodiment, fourteen panels including eight panels over which the inspection is carried out can be completed. Since the panels in which the inspection is performed also serves as end products, the yield can be improved.

Lastly, each of the panels is incorporated into the electric apparatus; therefore, the electric apparatus can be completed.

Further, this embodiment can be freely combined with any one of Embodiment Modes 1 to 3 and Embodiment 1.

Embodiment 3

In FIG. 7, an example of manufacturing a light emitting device (a top emission structure) provided over a substrate having an insulating surface with a light emitting element in which an organic compound layer is to be a light emitting layer is shown.

FIG. 7(A) is a top view of the light emitting device, while FIG. 7(B) is a cross-sectional view taken along a line A–A' in FIG. 7(A). Reference numeral 1101 indicated by a dotted line denotes a source signal line driver circuit; reference numeral 1102 denotes a pixel portion; and reference numeral 1103 denotes a gate signal line driver circuit. Further, reference numeral 1104 denotes a transparent sealing substrate; reference numeral 1105 denotes a first sealing member; and an inside surrounded by the first sealing member 1105 is filled with a transparent second sealing member 1107. The first sealing member 1105 contains a gap material for securing a space between substrates.

Reference numeral 1108 denotes a wiring for transmitting a signal to be inputted to the source signal line driver circuit 1101 and the gate signal line driver circuit 1103. The wiring 1108 receives a video signal or a clock signal from an FPC (flexible print circuit) 1109 which becomes an external input terminal. Although only the FPC is shown, a printed wiring board (PWB) may be attached to the FPC.

Subsequently, a sectional structure is described with reference to FIG. 7(B). A driver circuit and a pixel portion are formed over a substrate 1110. Here, the source signal line driver circuit 1101 as the driver circuit and the pixel portion 1102 are shown.

In the source signal line driver circuit 1101, a CMOS circuit in which an n-channel type TFT 1123 and a p-channel type TFT 1124 are combined is formed. The TFT which constitutes the driver circuit may be formed of a CMOS circuit, a PMOS circuit or an NMOS circuit which are publicly known in the art. In this embodiment, a driver-integrated type in which the driver circuit is formed over the substrate is shown, but the driver-integrated type is not necessarily applied. The driver circuit can be also formed outside instead of being formed over the substrate. A structure of the TFT using a polysilicon film as an active layer is not particularly limited thereto, and either a top gate type TFT or a bottom gate type TFT is permissible.

The pixel portion 1102 is formed of a plurality of pixels comprising a switching TFT 1111, a current controlling TFT I 112 and a first electrode (anode) 1113 which is electrically connected to the drain of the current-controlling TFT 1112. The current-controlling TFT 1112 may be either of an n-channel type TFT or a p-channel type TFT, but when it is to be connected to an anode, it is preferably the p-channel type TFT. It is also preferable that a storage capacitor (not shown) is appropriately provided. Here, only a cross sectional structure of one pixel in pixels arranged innumerably is shown, and an example of using two TFTs in the pixel is shown, however, three or more TFTs may appropriately be used per pixel.

Since it is constituted such that the first electrode 1113 is directly connected to the drain of the TFT, it is preferable that a lower layer of the first electrode 1113 be a material layer which is able to have an ohmic contact with the drain comprising silicon, and an uppermost layer which has a contact with a layer containing an organic compound be a material layer which has a large work function. For example, by adopting a three-layer structure comprising a titanium nitride film, a film containing aluminum as a primary component, and a titanium nitride film, a resistance of wiring can be lowered; a favorable ohmic contact can be obtained, and which can function as an anode. Further, as the first electrode 1113, a monolayer of such as a titanium nitride film, a chromium film, a tungsten film, a zinc film, a platinum film and the like, or a laminate of three layers or more may be used.

Further, an insulator 1114 (referred to as a bank, a partition, a barrier, an embankment or the like) is formed at each end of the first electrode (anode) 1113. The insulator 1114 may be formed of either an organic resin film or an insulating film comprising silicon. In the present embodiment, as for the insulator 1114, a positive type photosensitive acrylic resin film is used for forming an insulator in a shape as shown in FIG. 7.

For the purpose of enhancing a coverage effect, a curved surface having a curvature is to be formed in an upper end portion or a lower end portion of the insulator 1114. For example, when the positive type photosensitive acrylic resin is used as a material for the insulator 1114, it is preferable that a curved surface having a curvature radius (0.2 μm to 3 μm) is provided only to the upper end portion of the insulator 1114. As for the insulator 1114, either one of a negative type which becomes insoluble to an etchant by photosensitive light, or a positive type which becomes soluble to the etchant by the light can be used.

Further, the insulator 1114 may be covered with a protective film comprising at least one film of an aluminum nitride film, an aluminum oxynitride film, a thin film containing carbon as a main component, and a silicon nitride film.

Further, a layer 1115 containing an organic compound is selectively formed over the first electrode (anode) 1113 by vapor deposition using a vapor mask or inkjetting. Further, a second electrode (cathode) 1116 is formed over the layer 1115 containing the organic compound. As for the cathode, a material having a small work function (for example Al, Ag, Li, Ca, alloys of thereof, that is, MgAg, MgIn, AlLi, $CaF_2$, or CaN) may be used. In the present embodiment, in order to allow luminescence to pass through, as for the second electrode (cathode) 1116, a laminate of a metal thin film which is made thin in thickness and one of a transparent conductive film (an indium oxide-tin oxide alloy (ITO), an indium oxide-zinc oxide alloy ($In_2O_3$—ZnO), and zinc oxide (ZnO)) is used. Then, a light emitting element 1118 comprising the first electrode (anode) 1113, the layer 1115 containing the organic compound, and the second electrode (cathode) 1116 is formed. In the present embodiment, the light emitting element 1118 is allowed to be an example of emitting white light, and therein, a color filter (for the purpose of simplicity, an overcoat layer is not shown here) comprising a colored layer 1131 and a light blocking layer (BM) is provided.

Further, when layers each containing an organic compound in which R, G, and B luminescence can be respectively obtained, are selectively formed, a full-color display can be obtained without using a color filter.

Further, a transparent protective layer 1117 is formed in order to seal a light emitting element 1118. As the transparent protective layer 1117, the transparent protective laminate shown in Embodiment Mode 1 can be adopted. The transparent protective laminate comprises a laminate comprising a first inorganic insulating film, a stress relaxing film and a second inorganic insulating film. As each of the first and second inorganic insulating films, a film selected from a silicon nitride film, a silicon oxide film, a silicon oxynitride film (SiNO film (component ratio: N>O), or SiON film (component ratio: N<O)), and a thin film containing carbon as a main component (for example, DLC film, or CN film) which are obtained by sputtering or CVD can be used. These inorganic insulating films each have a high blocking effect against moisture; however, as film thickness thereof is increased, a film stress is increased, then, they tend to be partially peeled or totally removed as a film. Nevertheless, stress can be relaxed and, also, moisture can be absorbed by sandwiching the stress relaxing film between the first inorganic insulating film and the second inorganic insulating film. Even when a minute hole (pinhole or the like) is formed in the first inorganic insulating film by an undefined reason, the minute hole can be blocked by the stress relaxing film and, further, by providing the second inorganic insulating film thereover, an extremely high blocking effect against moisture or oxygen can be attained. As materials for the stress relaxing film, a material which has smaller stress than that of an inorganic insulating films and has a hygroscopic property is preferable. In addition to the above-described properties, a material having a translucent property is desirable. Further, as the stress relaxing film, a material film containing an organic compound such as α-NPD (4,4'-bis[N-(naphthyl)-N-phenyl-amino]biphenyl), BCP (bathocuproin), MTDATA (4,4',4'-tris(N-3-methylphenyl-N-phenyl-amino)triphenylamine, and $Alq_3$ (tris-8-quinolinolatealuminum complex) may be used. Each of these material films has a hygroscopic property, and when they are thin in thickness, they become nearly transparent. Since MgO, $SrO_2$, and SrO each have a hygroscopic property and translucency, and also, a thin film thereof can be obtained by vapor deposition, any one of these films can be used as the stress relaxing film. In the present embodiment, a silicon target is used, a film formed in an atmosphere containing a nitrogen gas and an argon gas, that is, a silicon nitride film having a high blocking effect against impurities such as moisture, and an alkali metal is used as the first inorganic insulating film or the second inorganic insulating film, and a thin film of $Alq_3$ formed by vapor deposition is used as the stress relaxing film. Further, in order to allow luminescence to penetrate the transparent protective laminate, it is preferable that an entire film thickness of the transparent protective laminate is formed as thin as possible.

Further, in order to seal the light emitting element 1118, the sealing substrate 1104 is bonded thereto by using the first sealing material 1105 and the second sealing material 1107 in an inert gas atmosphere. As the first sealing material 1105 and the second sealing material 1107, it is preferable that an epoxy resin is used. It is also preferable that the first sealing material and the second sealing material are each made of a material which does not allow moisture or oxygen to penetrate thereinto as much as possible.

Further, in the present embodiment, FRP (plastic substrate comprising fiberglass-reinforced plastics), PVF (polyvinylfluoride), Mylar, polyester, an acrylic resin, and the like, other than a glass substrate or a quartz substrate can be used as a material which constitutes the sealing substrate 1104. After the sealing substrate 1104 is bonded by using the first sealing material 1105 and the second sealing material 1107, it is possible to perform sealing by using a third sealing member such that a side face (exposed face) is covered.

As described above, by sealing the light emitting element into the transparent protective layer 1117, the first sealing member 1105, and the second sealing member 1107, the light emitting element can thoroughly be shielded from outside. In consequence, substance such as moisture and oxygen, which deteriorate the organic compound layer can be prevented from entering from outside. Accordingly, a light emitting device having high reliability can be obtained.

Further, as for the first electrode 1113, a both-side emission type light emitting device can be manufactured by using a transparent conductive film.

Further, in the present embodiment, an example of a structure, in which a layer containing an organic compound is formed over an anode and then a cathode which is a transparent electrode is formed over the layer containing the organic compound (hereinafter, referred to as a top emission structure) is shown; however, a structure in which an organic compound is formed over an anode, and a light emitting element in which a cathode is formed over the organic compound, and then luminescence generated in a layer containing the organic compound is drawn to a TFT from the anode which is a transparent electrode (hereinafter, a bottom emission structure), may also be permissible.

Figure 8:
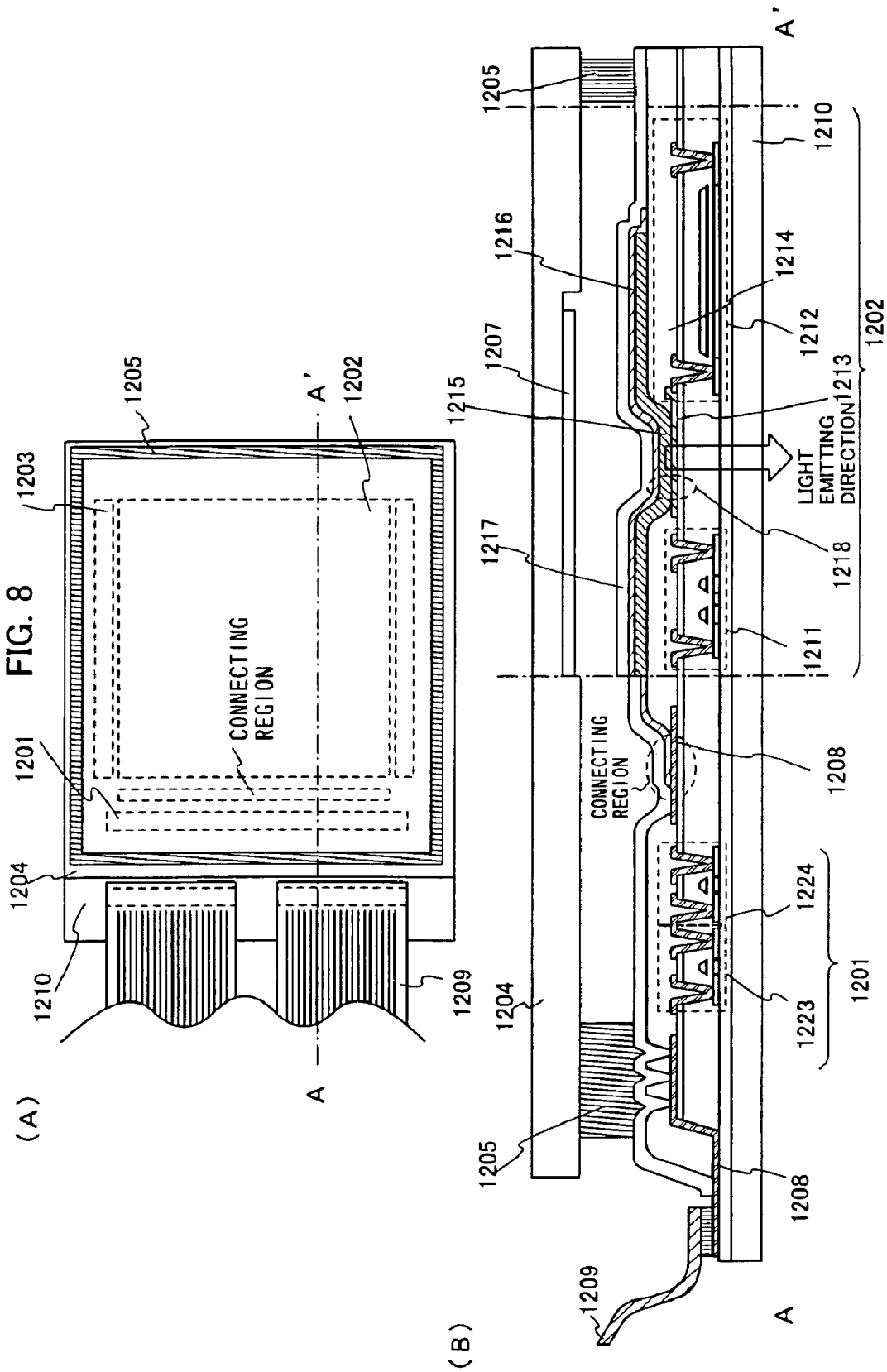
FIGS. 8A–8B are diagrams which show a light emitting device (Embodiment 3).

An example of a light emitting device having the bottom emission structure is shown in FIG. 8.

FIG. 8(A) is a top view of the light emitting device, while FIG. 8(B) is a cross-sectional view taken along a line A–A' in FIG. 8(A). Reference numeral 1201 indicated by a dotted line denotes a source signal line driver circuit; reference numeral 1202 denotes a pixel portion; and reference numeral 1203 denotes a gate signal line driver circuit. Further, reference numeral 1204 denotes a sealing substrate; reference numeral 1205 denotes a sealing member in which a gap material for securing a sealed space is contained; and an inside surrounded by the sealing material 1205 is filled with an inert gas (typically, a nitrogen gas). A trace of moisture in the inside space surrounded by the sealing material 1205 is eliminated by a desiccant 1207 and, accordingly, the space is sufficiently dry.

Reference numeral 1208 denotes a wiring for transmitting a signal to be inputted to the source signal line driver circuit 1201 and the gate signal line driver circuit 1203. The wiring 1208 receives a video signal or a clock signal from a flexible print circuit (FPC) 1209 which becomes an external input terminal.

Subsequently, a sectional structure will be described with reference to FIG. 8(B). A driver circuit and a pixel portion are formed on a substrate 1210, but the source signal line driver circuit 1201 as the driver circuit and the pixel portion 1202 are shown here. In the source signal line driver circuit 1201, a CMOS circuit in which an n-channel type TFT 1223 and a p-channel type TFT 1224 are combined is formed.

Further, the pixel portion 1202 is formed by a plurality of pixels comprising a switching TFT 1211, a current-controlling TFT 1212 and a first electrode (anode) 1213 comprising a transparent conductive film which is electrically connected to a drain of the current-controlling TFT 1212.

In the present embodiment, it is constituted such that the first electrode 1213 is formed so that a part thereof is overlapped with a connecting electrode and the first electrode 1213 is electrically connected to a drain region of the TFT through the connecting electrode. It is preferable that the first electrode 1213 has transparency, and an electrically conductive film having a large work function (for example, an ITO (indium oxide-tin oxide alloy), an indium oxide-zinc oxide alloy ($In_2O_3$—ZnO), or zinc oxide (ZnO)) is preferably used for the first electrode 1213.

Further, an insulator 1214 (referred to as a bank, a partition, a barrier, a embankment or the like) is formed over each end of the first electrode (anode) 1213. For the purpose of enhancing a coverage effect, a curved surface having a curvature is to be formed in an upper end portion or a lower end portion of the insulator 1214. Further, the insulator 1214 may be covered with a protective film comprising an aluminum nitride film, an aluminum oxynitride film, a thin film containing carbon as a main component, or a silicon nitride film.

Further, a layer 1215 containing an organic compound is selectively formed over the first electrode (anode) 1213 by vapor deposition using a vapor deposition mask or inkjetting. Further, a second electrode (cathode) 1216 is formed over the layer 1215 containing the organic compound. As the cathode, a material having a small work function (for example Al, Ag, Li, Ca, alloys thereof, that is, MgAg, MgIn, AlLi, $CaF_2$, or CaN) may be used. Then, a light emitting element 1218 comprising the first electrode (anode) 1213, the layer 1215 containing the organic compound, and the second electrode (cathode) 1216 is formed. The light emitting element 1218 emits light in a direction of an arrow shown in FIG. 8. The light emitting element 1218 in the present embodiment is one type of light emitting element which can obtain mono-color luminescence of R, G, or B. A full color can be acquired by three light emitting elements in which layers containing organic compounds wherein R, G, and B light emission can be respectively obtained is selectively formed.

Further, a protective layer 1217 is formed in order to seal the light emitting element 1218.

Further, in order to seal the light emitting element 1218, the sealing substrate 1204 is stuck thereto by using the sealing material 1205 in an inert gas atmosphere. A concave portion has been previously formed over the sealing substrate 1204 by sandblasting or the like and then, a desiccant 1207 is stuck to the thus-formed concave portion. As the sealing material 1205, it is preferable that an epoxy resin is used. It is also preferable that the sealing material 1205 is composed of a material which does not penetrate moisture or oxygen as much as possible.

Further, in this embodiment, as a material for constituting the sealing substrate 1204 having the concave portion, a plastic substrate comprising FRP (fiberglass-reinforced plastics), PVF (polyvinyl fluoride), Mylar, polyester, an acrylic resin, or the like, other than a metal substrate, a glass substrate or a quartz substrate can be used.

Further, the present embodiment can be freely combined with any one of Embodiment Modes 1 to 3, Embodiment 1, and Embodiment 2.

Embodiment 4

In this embodiment, a cross sectional structure of one pixel, particularly states and manners of connections in regard to a light emitting element and a TFT, and a shape of a wall provided between pixels is described.

In FIG. 9(A), reference numeral 40 denotes a substrate, 41 denotes a wall (also referred to as an embankment), 42 denotes an insulating film, 43 denotes a first electrode (anode), 44 denotes a layer containing an organic compound, 45 denotes a second electrode (cathode), and 46 denotes a TFT.

In the TFT 46, 46a denotes a channel forming region, 46b and 46c each denote a source region or a drain region, 46d denotes a gate electrode, 46e and 46f each denote a source electrode or a drain electrode. Although a top-gate type TFT is described in this embodiment, the TFT is not limited to a particular type, and a reverse stagger type TFT or a regular stagger type TFT is permissible. Further, 46f denotes the electrode which is connected with TFT 46 by allowing 46f to be in partial contact and overlapping with the first electrode 43.

Further, in FIG. 9(B), a cross sectional structure which is partially different from that shown in FIG. 9(A) is shown.

In FIG. 9(B), the overlapping manner between the first electrode and the electrode is different from that as shown in FIG. 9(A); namely, the first electrode is patterned and, then, the electrode is formed such that it is partially overlapped with the thus-patterned first electrode, thereby connecting with the TFT.

Further, in FIG. 9(C), a cross sectional structure which is partially different from that shown in FIG. 9(A) is shown.

In FIG. 9(C), an additional interlayer insulating layer is further provided, and the first electrode is connected with the electrode of the TFT through a contact hole.

Further, a cross sectional shape of the wall 41 may be a tapered shape as shown in FIG. 9(D). Such shape can be obtained by exposing a resist to light by using a photolithography method and, then, etching a non-photosensitive organic resin or an inorganic insulating film.

Still further, when a positive-type photosensitive organic resin is used, as shown in FIG. 9(E), a shape having a curved surface on a top end thereof can be obtained.

On the contrary, when a negative-type photosensitive resin is used, a shape as shown in FIG. 9(F) having a curved surface on each of top and bottom ends thereof can be obtained.

Further, this embodiment can be freely combined with any one of Embodiment Modes 1 to 3 and Embodiments 1 to 3.

Embodiment 5

Various modules (active matrix type EL module, active matrix type EC module) can be completed according to the present invention. Thus, all electronic apparatuses in which such modules are incorporated can be completed.

Figure 10:
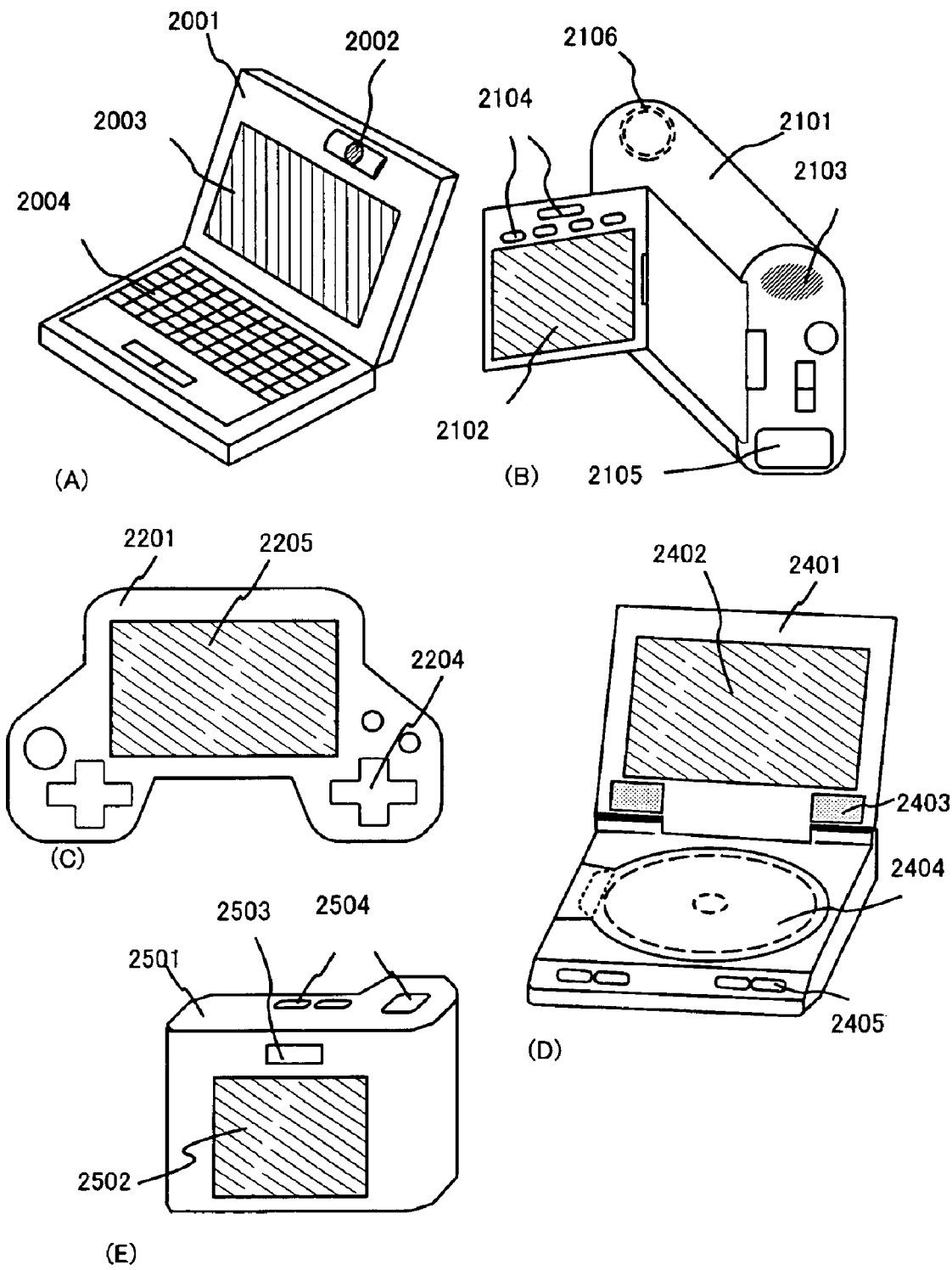
FIGS. 10A–10E are diagrams which show an example of electric apparatuses (Embodiment 5).
Figure 11:
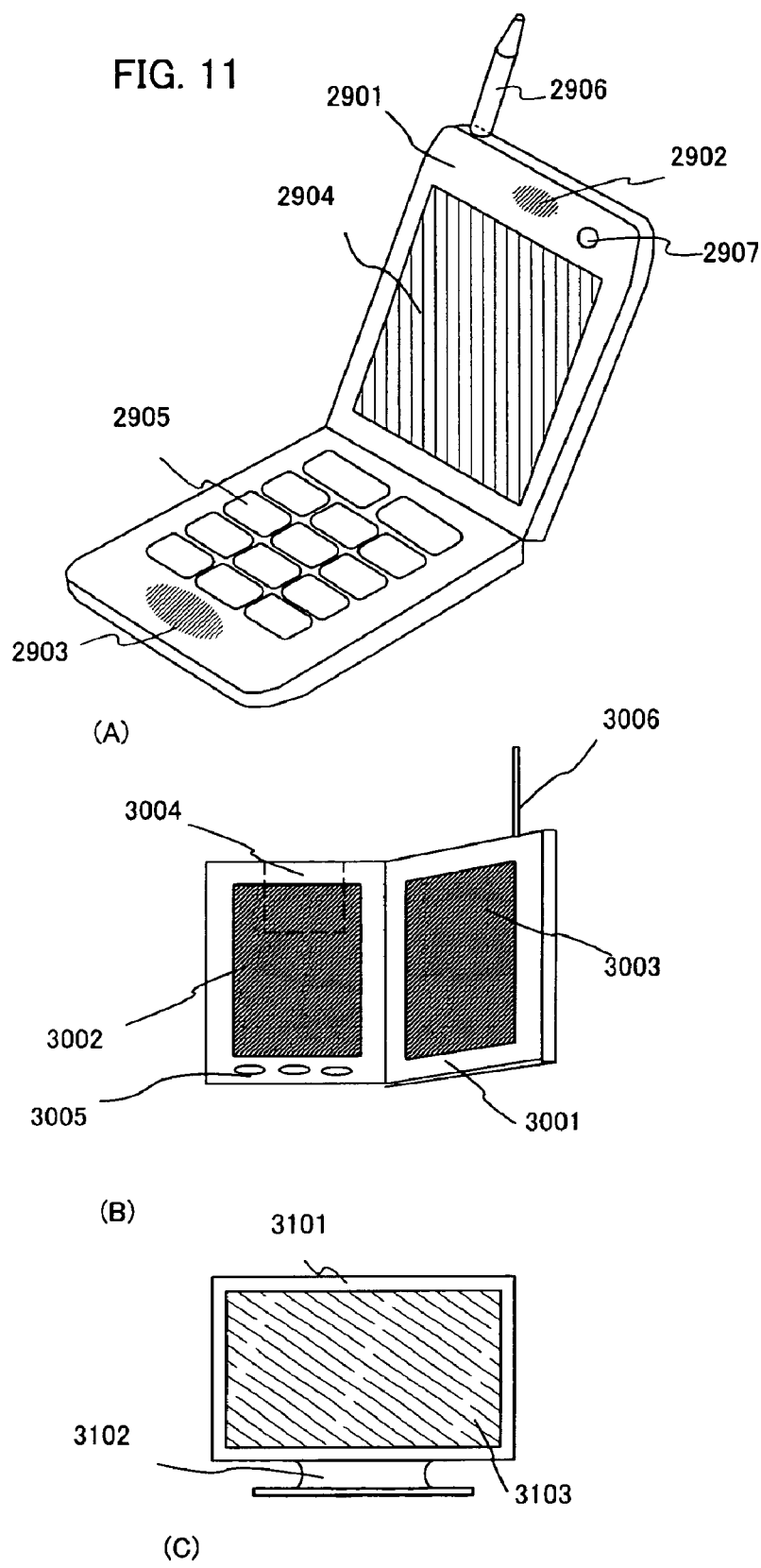
FIGS. 11A–11C are diagrams which show an example of electric apparatuses (Embodiment 5).

Such electronic apparatuses are as follows: a video camera, a digital camera, a head mounted display (a goggle type display), a car navigation system, a projector, a car stereo, a personal computer, a portable information terminal (a mobile computer, a mobile phone or an electronic books etc.), and the like. Practical examples thereof are shown in FIGS. 10 and 11.

FIG. 10(A) is a personal computer which includes a main body 2001, an image input portion 2002, a display portion 2003, a keyboard 2004 and the like.

FIG. 10(B) is a video camera which includes a main body 2101, a display portion 2102, a voice input portion 2103, operation switches 2104, a battery 2105, an image receiving portion 2106 and the like.

FIG. 10(C) is a game machine which includes a main body 2201, operation switches 2204, a display portion 2205 and the like.

FIG. 10(D) is a player using a recording medium which records a program (hereinafter, referred to as a recording medium), including a main body 2401, a display portion 2402, a speaker portion 2403, a recording medium 2404, an operation switches 2405 and the like. In addition, the player using a DVD (Digital Versatile Disc), a CD or the like as a recording medium can be used for enjoying music, cinema, game, Internet or the like.

FIG. 10(E) is a digital camera which includes a main body 2501, a display portion 2502, a view finder 2503, operation switches 2504, an image receiving portion (not shown in the drawing) and the like.

FIG. 11(A) is a mobile phone which includes a main body 2901, a voice output portion 2902, a voice input portion

2903, a display portion 2904, operation switches 2905, an antenna 2906, an image input portion (CCD, image sensor, etc.) 2907 and the like.

FIG. 11(B) is a portable book (electronic book) which includes a main body 3001, display portions 3002 and 3003, a recording medium 3004, operation switches 3005, an antenna 3006 and the like.

FIG. 11(C) is a display unit which includes a main body 3101, a supporting portion 3102, a display portion 3103 and the like.

In addition, the display shown in FIG. 11(C) has a small, medium or large size display portion, for example a size of 5 to 20 inches. Further, in order to manufacture the display portion with such sizes, it is preferable to use a substrate with one meter on a side to mass-produce the display portions.

As described above, the applicable range of the present invention is so wide that the invention can be applied to manufacturing methods of various fields of electronic apparatuses. Further the electronic apparatuses of this embodiment can be realized by utilizing any combination of structures in Embodiment Modes 1 to 3 and Embodiments 1 to 4.

Embodiment 6

The electronic apparatuses shown in Embodiment Mode 5 includes a panel in which a light emitting element is sealed, and wherein a module provided with IC including a controller and a power source circuit are mounted. The module and the panel are both corresponding to one mode of the light emitting device, respectively. In the present invention, a specific structure of the module will be described.

FIG. 12(A) shows an appearance of a module in which a panel 1800 is provided with a controller 1801 and a power source circuit 1802. The panel 1800 is provided with a pixel portion 1803 in which a light emitting element is provided for each pixel, a scanning line driver circuit 1804 for selecting a pixel in the pixel portion 1803, and a signal line driver circuit 1805 for supplying a video signal to the selected pixel.

The controller 1801 and the power source circuit 1802 are provided for a printed substrate 1806, various kinds of signals and power supply voltage outputted from the controller 1801 or the power source circuit 1802 are supplied for the pixel portion 1803 through an FPC 1807, the scanning line driver circuit 1804, and the signal line driver circuit 1805 in the panel 1800.

The power supply voltage and the various kinds of signals are supplied to the printed circuit 1806 through an interface (I/F) 1808 in which a plurality of input terminals is arranged.

Although the printed substrate 1806 is mounted on the panel 1800 with the FPC in this embodiment, the present invention is not limited to this structure. The controller 1801 and the power source circuit 1802 may be provided directly on the panel 1800 with COG (Chip on Class) method.

Further, in the printed substrate 1806, due to a capacitor formed between leading wirings and a resistance of a wiring itself, a noise is caused to a power supply voltage or a signal, or make a rise of a signal dull. Therefore, various kinds of elements such as a condenser and a buffer may be provided in order to prevent the noise from being caused to the power supply voltage or the signal and the dull rise of the signal in the printed substrate 1806.

FIG. 12(B) is a block diagram showing a structure of the printed substrate 1806. Various kinds of signals and power supply voltage supplied to the interface 1808 are supplied to the controller 1801 and the power source circuit 1802.

The controller 1801 has an A/D converter 1809, a phase locked loop (PLL) 1810, a control-signal generating portion 1811, and SRAM (Static Random Access Memory) 1812 and 1813. Although the SRAM is used in this embodiment, instead of the SRAM, SDRAM can be used and DRAM (Dynamic Random Access Memory) can be also used if it is possible to write in and read out data at high speed.

Video signals supplied through the interface 1808 are subjected to a parallel-serial conversion in the A/D converter 1809 and inputted into the control-signal generating portion 1811 as video signals corresponding to respective colors of R, G, and B. Further, based on various kinds of signals through the interface 1808, Hsync signal, Vsync signal, clock signal CLK, and volts alternating current (AC cont) are generated in the A/D converter 1809 and inputted into the control signal generating portion 1811.

The phase-locked loop 1810 has a function to synchronize the phase of the frequency of each signal supplied through the interface 1808 with the phase of the operating frequency of the control-signal generating portion 1811. The operating frequency of the control-signal generating portion 1811 is not necessarily the same as the frequency of each signal supplied through the interface 1808, but the operating frequency of the control-signal generating portion 1811 and the frequency of each signal supplied through the interface 1808 are adjusted in order to synchronize one another in the phase-locked loop 1810.

The video signal inputted to the control-signal generating portion 1811 is once written into and held on the SRAM 1812 and 1813. The control-signal generating portion 1811 reads out the video signals corresponding to all the pixels, one bit by one bit, from among all the bits of video signals held on the SRAM 1812 and supplies them to the source line driver circuit 1805 in the panel 1800.

Further, the control-signal generating portion 1811 supplies the information concerning a light emitting period in which the light emitting element of each bit emit light to the scanning line driver circuit 1804 in the panel 1800.

The power source circuit 1802 supplies a predetermined power supply voltage to the signal line driver circuit 1805, scanning-line driver circuit 1804, and pixel portion 1803 in the panel 1800.

Figure 13:
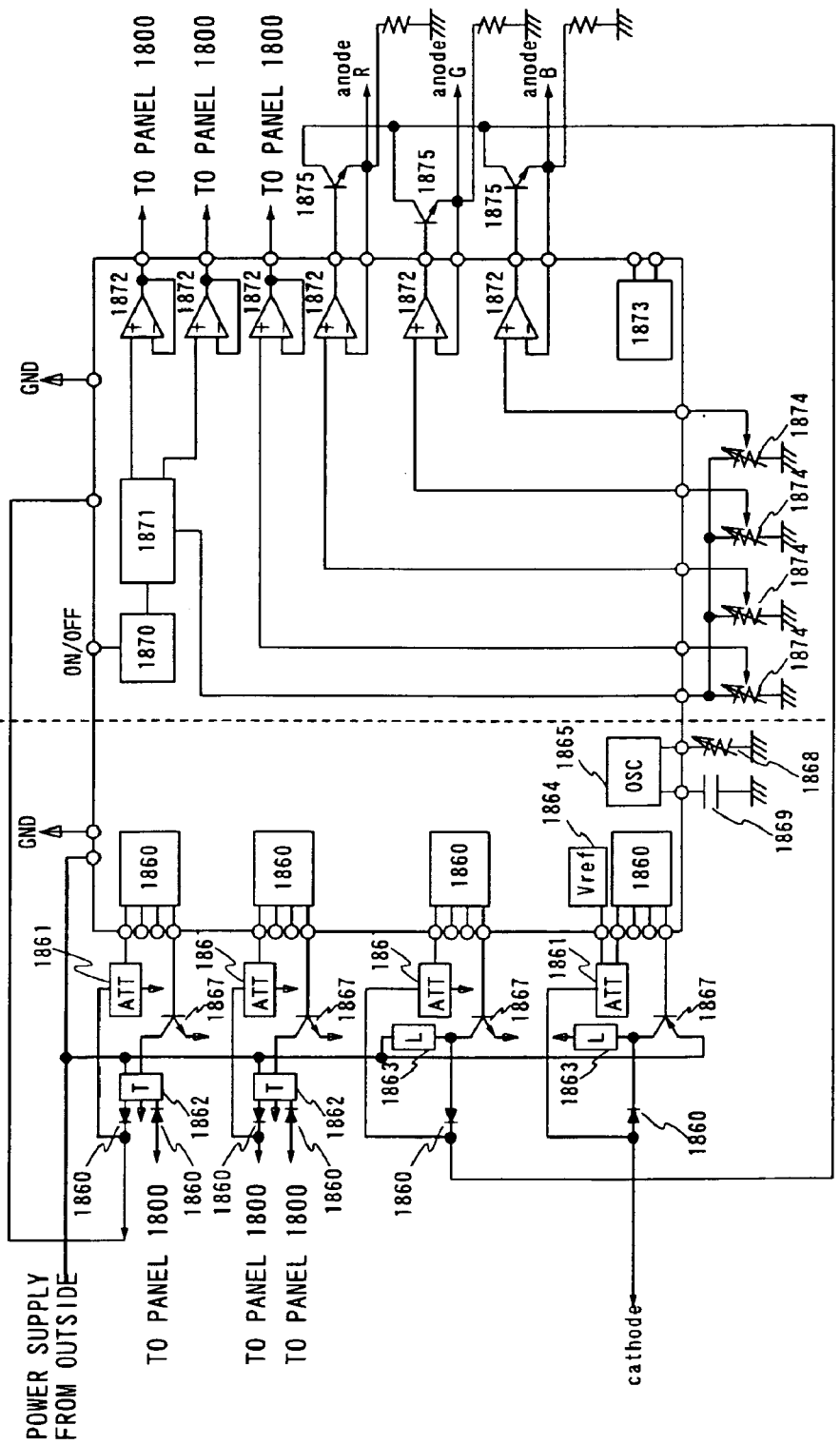
FIG. 13 is a diagram which shows a block diagram (Embodiment 6).

Explanation is now made on the structure of the power source circuit 1802 in detail with reference to FIG. 13. The power source circuit 1802 of this embodiment comprises a switching regulator 1854 using four switching regulator controls 1860 and a series regulator 1855.

Generally, the switching regulator is small in size and light in weight as compared to the series regulator and is able to raise voltage and invert polarities in addition to reduce voltage. On the other hand, the series regulator that is used only in voltage reduction has well output voltage accuracy as compared to the switching regulator, hardly causing ripples or noises. The power source circuit 1802 of this embodiment mode uses a combination of the both.

The switching regulator 1854 shown in FIG. 13 has a switching regulator control (SWR) 1860, an attenuator (ATT) 1861, a transformer (T) 1862, an inductor (L) 1863, a reference power supply (Vref) 1864, an oscillator circuit (OSC) 1865, a diode 1866, a bipolar transistor 1867, a varistor 1868 and a capacitor 1869.

By transforming a voltage of an external Li-ion battery (3.6 V) or the like in the switching regulator 1854, a power supply voltage to be supplied to a cathode and a power supply voltage to be supplied to the switching regulator 1854 are generated.

Further, the series regulator 1855 has a band-gap circuit (BG) 1870, an amplifier 1871, operational amplifiers 1872, a current source 1873, a varistor 1874 and a bipolar transistor 1875, and is supplied with a power supply voltage generated at the switching regulator 1854.

In the series regulator 1855, a power supply voltage generated by the switching regulator 1854 is used to generate a direct current power supply voltage to be supplied to a wiring (current supply line) for supplying current to the anodes of various-color of light emitting devices according to a constant voltage generated by the band-gap circuit 1870.

Further, the current source 1873 is used for a drive method to write video signal current to a pixel. In this case, the current generated in the current source 1873 is supplied to the source line driver circuit 1805 in the panel 1800. In the case of a drive method to write the video signal voltage to a pixel, the current source 1873 is not always required.

Further, a switching regulator, an OSC, an amplifier and an operation amplifier are formed using a TFT.

Further, a structure of this embodiment may be freely combined with any of the structures of Embodiment Modes 1 to 3 and Embodiments 1 to 5.

Embodiment 7

In this embodiment, an example of manufacturing a passive matrix type light emitting device (also referred to as simple matrix type light emitting device) is illustrated.

First, a plurality of first wirings are formed into striped form over the substrate using a material such as ITO (a material to be an anode). Next, a bank formed of resist or photosensitive resin is formed so as to encircle a region to be a light emitting region. Then, a layer containing an organic compound is formed in the region that is encircled with the bank by vapor deposition or inkjetting. In the case of achieving a full color display, a layer containing an organic compound is formed by selecting appropriate materials. Striped plural second wirings are formed of a metal material such as Al or an alloy of Al (a material to be a cathode) over the wall and the layer containing an organic compound so as to intersect with the plural first wirings formed of ITO. According to the above-described steps, a light emitting element using a layer containing an organic compound as a light emitting layer can be manufactured.

Furthermore, the substrate is sealed with a sealing substrate by using a sealing member, or sealed after forming a protective film over the second wirings.

As is the case with Embodiment mode 1, a plurality of light emitting regions is provided for one substrate. After sticking the sealing substrate. The one part of the sealing substrate is removed, and only one part thereof is examined (light emitting inspection).

Then, the one which proved to be good quality is shipped. And each of which is divided in the shipped destination, thereby manufacturing a plurality of panels. According to the present invention, multi-panel forming can be performed without providing with a circuit and a terminal for the inspection. Further, since the panels over which the inspection has done are also incorporated into the end products, yield is improved and the panel can be efficiently manufactured.

Further, the present invention can be applied to not only a full color display device, but also a mono color light emitting device, for example, an electro spectacular and lighting for illumination.

Further, the present invention can be freely combined with any one of Embodiment Modes 1 to 3, Embodiment 1, Embodiment 2, and Embodiment 5.

What is claimed is:

1. A method for manufacturing a light emitting device by comprising the steps of:

forming a plurality of light emitting regions and terminal portions over a first substrate in a first place;

sealing a light emitting element with a second substrate in the first place;

removing one part of the second substrate overlapped with one part of a plurality of terminal portions by separating, and exposing the one part of the terminal portions in the first place;

inspecting by applying a current only to the one part of the terminal portions in the first place;

transporting from the first place to a second place, cutting off the first and the second substrates and dividing into each light emitting region in the second place; and attaching an FPC to a terminal portion connected to one light emitting region in the second place.

2. A method according to claim 1, wherein n×m (n>1 and m>1) light emitting regions are arranged in n lines and m columns in the first substrate.

3. A method for manufacturing a light emitting device comprising the steps of:

forming a plurality of light emitting regions and terminal portions over a first substrate in a first place;

sealing a light emitting element with a second substrate in the first place;

dividing the first substrate in the first place;

removing one part of the second substrate overlapped with one part of a plurality of terminal portions by separating, and exposing the one part of the terminal portions in the first place;

inspecting by applying a current only to the one part of the terminal portions in the first place;

transporting from the first place to a second place, cutting off the first and the second substrates and dividing into each light emitting region in the second place; and attaching an FPC to a terminal portion connected to one light emitting region.

4. A method according to claim 1, wherein a plurality of light emitting elements and a plurality of TFTs are provided for the light emitting region.

5. A method according to claim 1, wherein the second substrate has the same size as that of the first substrate or smaller size than that of the first substrate.

6. A method according to claim 1, wherein the light emitting device is one of a video camera, digital camera, a display, a car navigation, a personal computer, and a personal digital assistant.

7. A method according to claim 3, wherein the plurality of light emitting elements and a plurality of TFTs are provided for the light emitting region.

8. The method according to claim 3, wherein the second substrate has the same size as that of the first substrate or smaller size than that of the first substrate.

9. A method according to claim 3, wherein the light emitting device is one of a video camera, digital camera, a display, a car navigation, a personal computer, and a personal digital assistant.

* * * * *